United States Patent
Hsieh et al.

(10) Patent No.: US 8,514,000 B1
(45) Date of Patent: Aug. 20, 2013

(54) META-HARDENED FLIP-FLOP

(75) Inventors: Wei-Chih Hsieh, Taoyuan (TW);
Shang-Chih Hsieh, Yangmei (TW);
Chih-Chiang Chang, Zhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/562,539

(22) Filed: Jul. 31, 2012

(51) Int. Cl.
*H03K 3/00* (2006.01)

(52) U.S. Cl.
USPC ...................................................... 327/218

(58) Field of Classification Search
USPC .............. 327/199–203, 208, 210–212, 214, 327/215, 218
See application file for complete search history.

(56) References Cited

U.S. PATENT DOCUMENTS 6,445,235 B1 * 9/2002 Sachdev ........................ 327/202

* cited by examiner

*Primary Examiner* — Lincoln Donovan
*Assistant Examiner* — Sibin Chen
(74) *Attorney, Agent, or Firm* — Eschweiler & Associates, LLC

(57) ABSTRACT

Some embodiments relate to a flip-flop having a data input terminal, a data output terminal and a clock terminal. The flip-flop includes a master latch, a slave latch, and an isolation element coupled between the master latch output and slave latch. The isolation element is arranged to isolate capacitive loading seen by the output of the master latch that comes from the slave latch. In some embodiments, the master latch includes one or more drive enhancement elements on its feedforward and feedback paths. The slave latch can also include one or more drive enhancement elements on its feedforward and feedback paths. These drive enhancement elements, particularly in combination with the isolation element, may help to reduce the setup and hold times and enhance meta-stability resistance of the flip-flop relative to conventional implementations. Other embodiments are also disclosed.

19 Claims, 3 Drawing Sheets

500

| | Base flip-flop (Fig. 5) | Meta-hardened flip-flop (e.g., Fig. 4) |
|---|---|---|
| Rise MTBF (yrs): | 3.93E-12 | 1.04E-02 |
| Fall MTBF (yrs) | 1.49E-11 | 2.16E-04 |

META-HARDENED FLIP-FLOP

BACKGROUND

In electronics, a flip-flop is a circuit that has two stable states and can be used to store state information. In digital circuits, the states are commonly assigned to a logical-"1" and a logical-"0", respectively. Applying signals to one or more control inputs of the flip-flop can change the state stored in the flip-flop (e.g., from a "1" to a "0", or vice versa), and can correspondingly change the output provided by the flip-flop. Flip-flops are a fundamental building block of digital electronics systems used in computers, communications, and many other types of systems.

DETAILED DESCRIPTION

Figure 1:
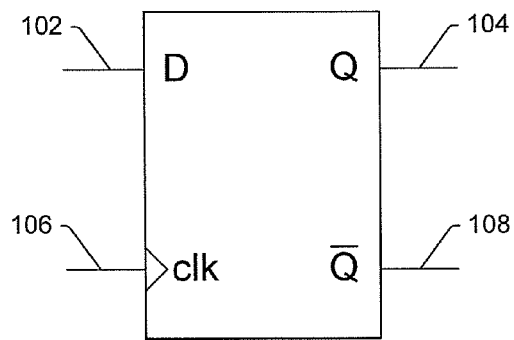
FIG. 1 shows a circuit symbol for a D-type flip-flop.

One or more implementations of the present invention will now be described with reference to the attached drawings, wherein like reference numerals are used to refer to like elements throughout. The drawings are not drawn to scale.

FIG. 1 illustrates a circuit symbol for a conventional D flip-flop 100. The flip-flop 100 has a data input terminal (D) 102, a data output terminal (Q) 104, and a clock terminal (CLK) 106. An inverted output terminal (Q-bar) 108 can also be included, as can asynchronous set and reset terminals (not illustrated).

During operation, data presented on the input terminal 102 is stored or "clocked" into the flip-flop 100 only when a suitable clock event occurs on clock terminal 106 (e.g., when a rising edge of the clock occurs). Thus, if the flip-flop 100 currently stores a "1" state, the "1" state will remain stored in the flip-flop and will be output to the output terminal 104 regardless of the state present on the data input terminal 102, so long as a clock event does not occur. If data the input terminal 102 changes to a "0" and a clock event occurs, the flip-flop can "latch" the new "0" data state, and will continue to store the "0" state until the next clock event occurs. Thus, the "clocked" data stored in the flip-flip 100 remains on the output terminal 104 until a clock event occurs, after which the output data is updated to reflect new data present on the input terminal 102.

Figure 2:
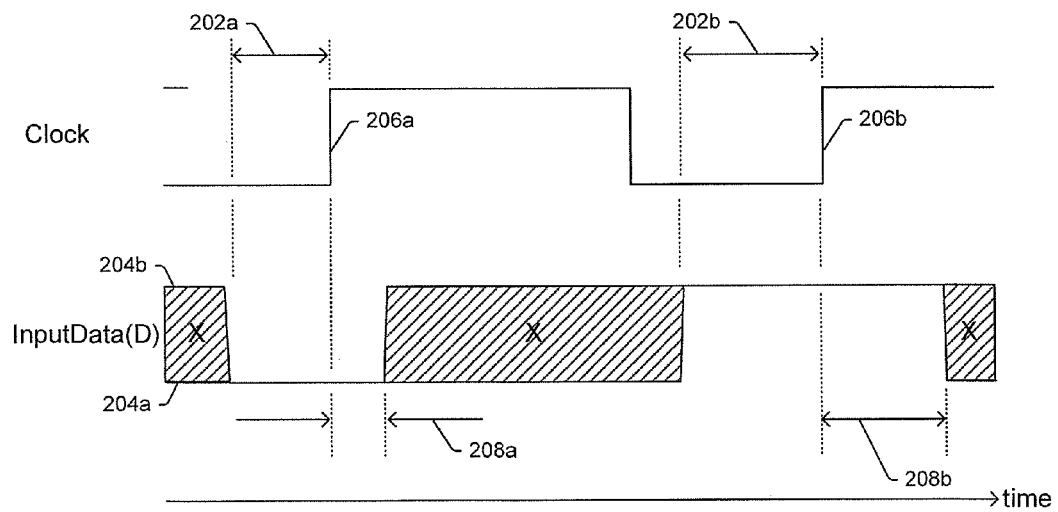
FIG. 2 shows a timing diagram illustrating setup and hold times for FIG. 1's D flip-flop.

In order to store data in this fashion, certain timing constraints are followed. These timing constraints are referred to as setup and hold times and are illustrated in FIG. 2. Setup time is the minimum amount of time the input data on input terminal 102 should be held steady before a clock event to ensure the input data is reliably latched. FIG. 2 shows two setup times—setup time 202a for a low data state 204a to be latched, and a setup time 202b for a high data state 204b to be latched, wherein both setup times are measured relative to a corresponding rising edge clock event 206a, 206b, respectively. Hold time is the minimum amount of time the input data signal on input terminal 102 should be held steady after the clock event so that the input data is reliably latched. FIG. 2 shows two hold times—a hold time 208a for a low data state 204a to be latched, and a hold time 208b for a high data state 204b to be latched, wherein both hold times are measured relative to a corresponding clock event 206a, 206b, respectively.

It is largely irrelevant what happens outside of the setup and hold windows (indicated as don't care states "X" in FIG. 2). So long as the input data remains set during the setup and hold times, data will be properly latched in the flip-flop 100. On the other hand, if setup and hold times are not adhered to (e.g., if the state on the input terminal 102 changes during the setup or hold times 202, 208), the flip-flop 100 can enter a meta-stable state where its stored state oscillates rapidly between two states (e.g., 204a, 204b), rather than settling quickly into one state or the other as desired.

To provide a good blend of performance (e.g., high data throughput) and reliability (e.g., limited data errors), some embodiments relate to flip-flops that have reduced setup and hold times, relative to conventional implementations. Because of the reduced set-up and hold times, these embodiments allow greater data throughput than conventional solutions while still providing reliable data storage without inducing meta-stable states.

Figure 3:
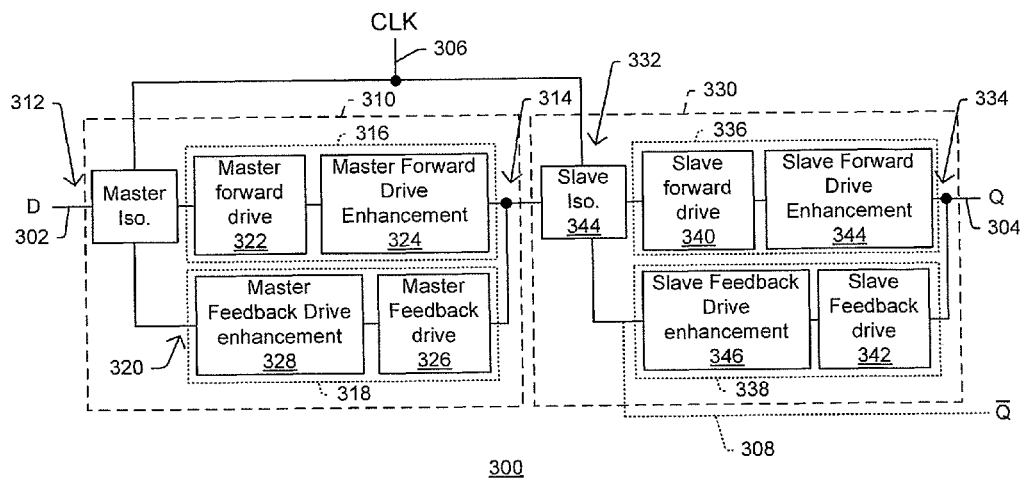
FIG. 3 shows a block diagram for a meta-hardened flip-flop in accordance with some embodiments.

FIG. 3 shows an example of a flip-flop 300 that provides reduced setup and hold times and increased meta-stability resistance, relative to conventional approaches. Flip-flop 300 includes a data input terminal 302, a data output terminal 304, and a clock terminal 306. An inverted data output terminal 308 can also be present, as well as an asynchronous set terminal and an asynchronous reset terminal (not shown). Although FIG. 3 follows naming conventions of a D-type flip-flop (e.g., input data D, output data Q), the techniques disclosed herein are also applicable to other types of latches and flip-flops and are not limited in any way to D-type flip-flops. For example, other common flip-flops contemplated as falling within the scope of this application are Set-Reset (SR), Toggle (T), and JK flip-flops, which can be triggered by rising edge clock events or falling edge clock events. All such embodiments are contemplated as falling within the scope of the present application.

Within flip-flop 300, a master latch 310 has a master latch input 312 coupled to the data input terminal 302 and also has a master latch output 314. A master feedforward path 316 is coupled between the master latch input 312 and master latch output 314. The master feedforward path 316 includes a master forward drive element 322 arranged in series with one or more master forward drive enhancement elements 324. A master feedback path 318 has an input end coupled to the master latch output 314 and an output end 320 coupled to an input end of the master feedforward path 316. The master feedback path 318 includes a master feedback drive element 326 arranged in series with one or more master feedback drive enhancement elements 328.

A slave latch 330 has a slave latch input 332 coupled to the master latch output 314 and has a slave latch output 334 coupled to the data output terminal 304. A slave feedforward path 336, which includes a slave forward drive element 340 and a slave forward drive enhancement element 344, and slave feedback path 338, which includes a slave feedback drive element 342 and a slave forward drive enhancement element 346, are operably coupled between the slave latch input 332 and slave latch output 334. Slave feedback path 338 couples an output end of the slave feedforward path 336 to an input end of the slave feedforward path 336.

An isolation element 344, which is coupled between the master latch output 314 and the input end of the slave feedforward path 336, is arranged to isolate capacitive loading seen by the output of the master latch 310 that comes from the slave latch 330. By limiting capacitive loading, the isolation element 344 helps to reduce setup and hold times and correspondingly improve metastability resistance.

During operation, data is clocked from the input terminal 302 into the master latch 310 and slave latch 330 when a clock event, such as a rising clock edge for example, occurs. After the data is presented and clocked, the master forward path 316 and master feedback path 318 store the data and/or an inverted version of the data in the master latch 310 in a mutually reinforcing manner. Similarly, the slave forward drive 340 and slave feedback drive 342 also store the data and/or an inverted version of the data in the slave latch 330 in a mutually reinforcing manner. In addition to the isolation element 344 reducing setup and hold times, the presence of the master drive enhancement elements 324, 328 also helps to reduce setup and hold times to improve meta-stability resistance.

Although FIG. 3 shows master forward and feedback drive enhancement elements 324, 328 and slave forward and feedback drive enhancement elements 344, 346, it will be appreciated that some embodiments can omit one or more of these elements. For example, some un-illustrated flip-flop implementations can include only master forward and feedback drive enhancement elements 324, 328 (and omit slave forward and feedback drive enhancement elements 344, 346). Other un-illustrated flip-flop implementations can include only slave forward and feedback drive enhancement elements 344, 346 (and omit master forward and feedback drive enhancement elements 324, 328).

Figure 4:
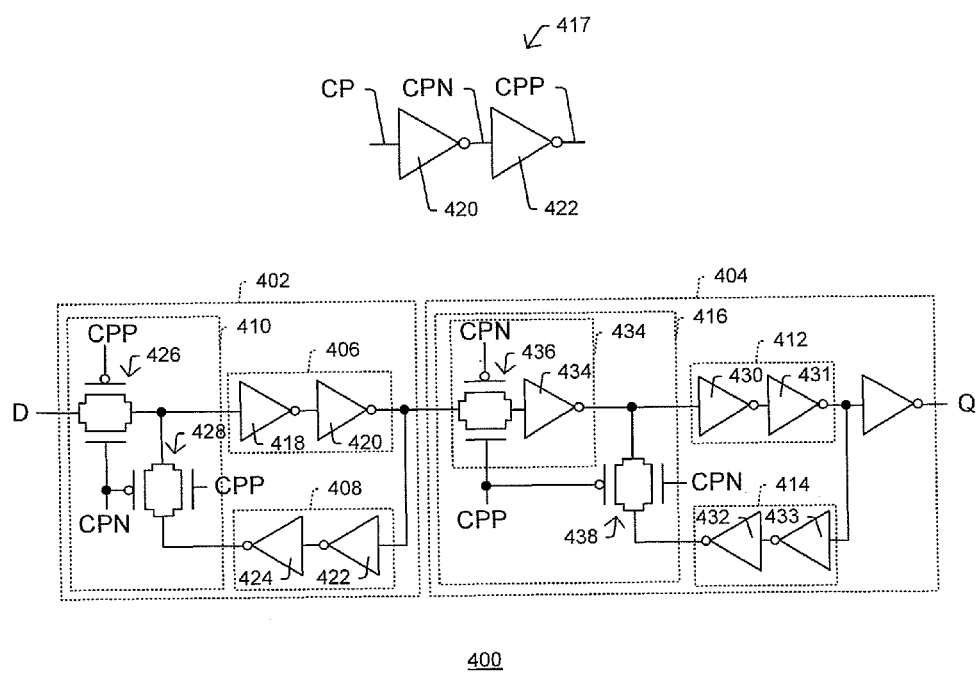
FIG. 4 another meta-hardened flip-flop in accordance with some embodiments.

FIG. 4 shows another embodiment of a meta-hardened flip flop 400 in accordance with some embodiments. Like FIG. 3's embodiment, meta-hardened flip-flop 400 includes a master latch 402 and a slave latch 404. The master latch 402 includes a master feedforward path 406, a master feedback path 408, and a master isolation element 410; while the slave latch 404 includes a slave feedforward path 412, a slave feedback path 414, and a slave isolation element 416. A clock signal buffer 417 can include a series of inverters 420, 422 arranged in series to provide CP clock signal, a CPN clock signal a CPP clock signal, wherein each clock signal is an inverted version of the previous clock.

The master feedforward path 406 comprises a master forward drive element in the form of an inverter 418, and one or more master forward drive enhancement elements in the form of respective inverters (e.g., 420). Similarly, the master feedback path 408 comprises a master feedback drive element in the form of an inverter 422, and one or more master forward drive enhancement elements in the form of respective inverters (e.g., 424). Thus, although FIG. 4 shows two inverters arranged in series on the master feedforward path 406 and the master feedback path 408, additional inverters can also be present. The master isolation element 410 includes a first master gating element 426 to selectively couple an input end of the master feedforward path 406 to the input terminal (D) based on clock signal CPP/CPN. In FIG. 4's embodiment the first master gating element 426 is a transmission gate made up of an NMOS transistor and PMOS transistor, although in other embodiments other gating elements could be used (e.g., an NMOS transistor or a PMOS transistor). A second gating element 428 selectively couples an output of master feedback path 408 to the input end of master feedforward path 406. The first gating element 426 is arranged to be off when second gating element 428 is on, and vice versa. Thus, when data is to be "clocked" into the flip flop 400, the first gating element 426 is opened, and the second gating element 428 is closed to program data into the flip-flop. When the clocked data is to be stored after the clock event, the first gating element 426 is closed and the second gating element 428 is opened, thereby latching data in the master latch.

The slave feedforward path 412 comprises a slave forward drive element in the form of an inverter 430, and one or more master forward drive enhancement elements in the form of respective inverters (e.g., 431). Similarly, the slave feedback path 408 comprises a slave feedback drive element in the form of an inverter 432, and one or more slave feedback drive enhancement elements in the form of respective inverters (e.g., 433). The slave isolation element 416 includes an inverter 434 that is selectively enabled based on clock signal, and which is selectively coupled to an input of the slave latch (and/or to an output of the master latch) via third gating element 436. Although the third gating element 436 is illustrated as a transmission gate, in other embodiments other gating elements could be used (e.g., an NMOS transistor or a PMOS transistor). A fourth gating element 438 selectively couples an output of slave feedback path to the input end of slave feedforward path. The third gating element 436 is arranged to be off when fourth gating element 438 is on, and vice versa.

Figures 5, 6:
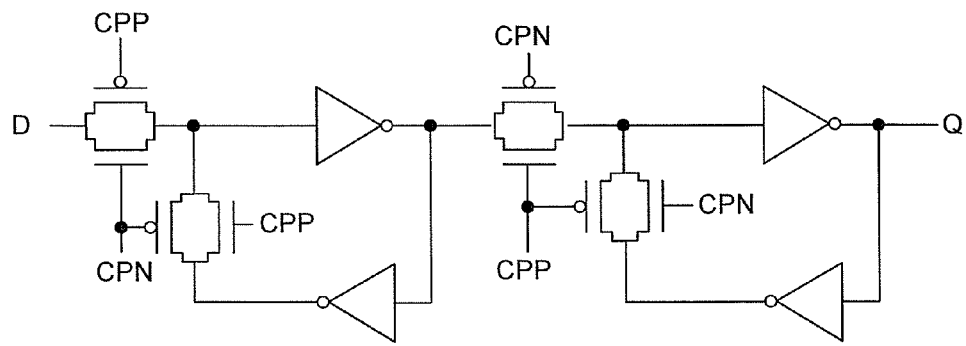
FIG. 5 shows a base flip-flop that has relatively poor meta-stability resistance and relatively long setup and hold times, relative to that of FIG. 4.
FIG. 6 is a chart showing simulated Mean-Time-Between-Failures (MTBF) values for a meta-hardened flip-flop and a base flip-flop.

To provide some insights into how FIG. 4's flip-flop, for example, can reduce setup and hold times and correspondingly increase meta-stability resistance relative to other implementations, FIG. 5 shows a flip-flop 500 including only a single inverter in the feedforward and feedback master paths (i.e., lacking drive enhancement elements previously shown in FIGS. 3-4). Further, FIG. 6 shows a performance comparison between the flip-flop of FIG. 5 and the meta-hardened flip-flop of FIG. 4.

As can be seen from FIG. 6, the meta-hardened flip-flop 400, which includes a clock enabled inverter and enhancement elements, has a significantly shorter Mean-Time-Between-Failures (MTBF) compared with FIG. 5's base flip-flop lacking these elements. These simulated results were based on a low-voltage technology (operating voltage of about 0.8V) operating at −25° C. with a 666 MHz clock and data being presented at 333 MHz intervals. In particular, the rise MTBF has been reduced from about 3.93E-12 years to about 1.04E-02 years, which represents a significant improvement. Similarly, the fall MTBF has been reduced from about 1.49E-11 to about 2.16E-04, which also represents a significant improvement. Note, as with most MTBF predictions, the MTBF predictions in FIG. 6 are not intended to correspond to absolute values for MTBF for correspondingly manufactured devices, but rather the intent of these MTBF predictions is to compare how weak links in the respective designs compare.

Some embodiments relate to a flip-flop having a data input terminal, a data output terminal and a clock terminal. The flip-flop includes a master latch having a master latch input coupled to the data input terminal and having a master latch output. A master feedforward path is coupled between the master latch input and master latch output. A master feedback path couples an output end of the master feedforward path to an input end of the master feedforward path. The flip-flop also includes a slave latch having a slave latch input coupled to the master latch output and having a slave latch output coupled to the data output terminal. A slave feedforward path is coupled between the slave latch input and slave latch output. A slave feedback path couples an output end of the slave feedforward path to an input end of the slave feedforward path. An isolation element, which isolates capacitive loading seen by the output of the master latch that comes from the slave latch, couples the master latch output to the input end of the slave feedforward path.

Some embodiments relate to a flip-flop having a data input terminal, a data output terminal and a clock terminal. The flip-flop includes a master latch having a master latch input and a master latch output with a master feedforward path and master feedback path coupled therebetween. The master feedforward and master feedback paths each comprise a plurality of inverters arranged in an inverter chain. A slave latch has a slave latch input coupled to the master latch output and has a slave latch output. A slave feedforward path and slave feedback path are coupled between the slave latch input and slave latch output. The slave feedforward and slave feedback paths each include a plurality of inverters. An isolation element is coupled between the master latch output and the input end of the slave feedforward path. The isolation element is arranged to isolate capacitive loading seen by the output of the master latch that comes from the slave latch. Some embodiments relate a flip-flop having a data input terminal, a data output terminal, and a clock terminal. The flip-flop includes a master latch having a master latch input and a master latch output with a master feedforward path and master feedback path coupled therebetween. The master feedforward and master feedback paths each comprise a plurality of inverters arranged in series. The master latch includes a first gating element to selectively couple the master latch input to the data input terminal based on a clock signal. A slave latch has a slave latch input coupled to the master latch output and has a slave latch output. A slave feedforward path and slave feedback path are coupled between the slave latch input and slave latch output. The slave feedforward and slave feedback paths each comprise a plurality of inverters arranged in series. The slave latch includes a slave isolation element having a second gating element to selectively couple the slave latch input to the master latch output based on the clock signal.

It will be appreciated that identifiers such as "first" and "second" do not imply any type of ordering or placement with respect to other elements; but rather "first" and "second" and other similar identifiers are just generic identifiers. In addition, it will be appreciated that the term "electrically connected" includes direct and indirect connections. For example, if element "a" is electrically connected to element "b", element "a" can be electrically connected directly to element "b" and/or element "a" can be electrically connected to element "b" through element "c", so long as there is an operable electrical connection between elements "a" and "b".

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A flip-flop having a data input terminal, a data output terminal and a clock terminal, the flip-flop comprising:
    a master latch having a master latch input coupled to the data input terminal and having a master latch output, wherein a master feedforward path is coupled between the master latch input and master latch output, wherein the master latch further comprises a master feedback path coupling an output end of the master feedforward path to an input end of the master feedforward path;
    a slave latch having a slave latch input coupled to the master latch output and having a slave latch output coupled to the data output terminal, wherein a slave feedforward path is coupled between the slave latch input and slave latch output, and the slave latch further comprises a slave feedback path coupling an output end of the slave feedforward path to an input end of the slave feedforward path; and
    an isolation element coupled between the master latch output and the input end of the slave feedforward path, the isolation element arranged to isolate capacitive loading seen by the output of the master latch that comes from the slave latch;
    wherein the master feedforward path includes a master forward drive element and one or more master forward drive enhancement elements; and
    wherein the master feedback path includes a master feedback drive element and one or more master feedback drive enhancement elements.

2. The flip-flop of claim 1, wherein the isolation element comprises an inverter that is selectively enabled based on a clock signal.

3. The flip-flop of claim 1, wherein the master forward drive element comprises an inverter, and the one or more master forward drive enhancement elements comprise respective inverters.

4. The flip-flop of claim 3, wherein the master feedforward path and master feedback path comprise the same number of inverters.

5. The flip-flop of claim 4:
    wherein the slave feedforward path includes a slave forward drive element and one or more slave forward drive enhancement elements; and
    wherein the slave feedback path includes a slave feedback drive element and one or more slave feedback drive enhancement elements.

6. The flip-flop of claim 5, wherein the slave forward drive element comprises an inverter, and the one or more slave forward drive enhancement elements comprise respective inverters.

7. A flip-flop having a data input terminal, a data output terminal and a clock terminal, the flip-flop comprising:
    a master latch having a master latch input coupled to the data input terminal and having a master latch output, wherein a master feedforward path is coupled between the master latch input and master latch output, wherein the master latch further comprises a master feedback path coupling an output end of the master feedforward path to an input end of the master feedforward path;
    a slave latch having a slave latch input coupled to the master latch output and having a slave latch output coupled to the data output terminal, wherein a slave feedforward path is coupled between the slave latch input and slave latch output, and the slave latch further comprises a slave feedback path coupling an output end of the slave feedforward path to an input end of the slave feedforward path; and an isolation element coupled between the master latch output and the input end of the slave feedforward path, the isolation element arranged to isolate capacitive loading seen by the output of the master latch that comes from the slave latch;

wherein the slave feedforward path includes a slave forward drive element and one or more slave forward drive enhancement elements; and wherein the slave feedback path includes a slave feedback drive element and one or more slave feedback drive enhancement elements.

8. The flip-flop of claim 1, where the master latch includes a first gating element to selectively couple an input end of the feedforward path to the input terminal based on a clock signal.

9. The flip-flop of claim 8, where the master latch further includes a second gating element to selectively couple an output of feedback path to the input end of feedforward path.

10. The flip-flop of claim 9, where the first gating element is arranged to be off when second gating element is on, and vice versa.

11. A flip-flop having a data input terminal, a data output terminal and a clock terminal, the flip-flop comprising:

a master latch having a master latch input and a master latch output with a master feedforward path and master feedback path coupled therebetween, wherein the master feedforward and master feedback paths each comprise a plurality of inverters arranged in an inverter chain;

a slave latch having a slave latch input coupled to the master latch output and having a slave latch output, wherein a slave feedforward path and slave feedback path are coupled between the slave latch input and slave latch output, wherein the slave feedforward and slave feedback paths each comprise a plurality of inverters arranged in an inverter chain; and an isolation element coupled between the master latch output and an input end of the slave feedforward path, the isolation element arranged to isolate capacitive loading seen by the output of the master latch that comes from the slave latch.

12. The flip-flop of claim 11, wherein the isolation element comprises an inverter that is selectively enabled and disabled based on a clock signal.

13. The flip-flop of claim 11, wherein the master feedforward path and master feedback path comprise the same number of inverters.

14. The flip-flop of claim 11, where the master latch includes a first master gating element to selectively couple an input end of the feedforward path to the input terminal based on a clock signal.

15. The flip-flop of claim 14, where the master latch further includes a second gating element to couple an output of feedback path to an input end of feedforward path.

16. The flip-flop of claim 15, where the first gating element is arranged to be off when second gating element is on, and vice versa.

17. A flip-flop having a data input terminal, a data output terminal and a clock terminal, the flip-flop comprising:

a master latch having a master latch input and a master latch output with a master feedforward path and master feedback path coupled therebetween, wherein the master feedforward and master feedback paths each comprise a plurality of inverters arranged in series and wherein the master latch includes a first gating element to selectively couple the master latch input to the data input terminal based on a clock signal;

a slave latch having a slave latch input coupled to the master latch output and having a slave latch output, wherein a slave feedforward path and slave feedback path are coupled between the slave latch input and slave latch output, wherein the slave feedforward and slave feedback paths each comprise a plurality of inverters arranged in series and wherein the slave latch includes a slave isolation element having a second gating element to selectively couple the slave latch input to the master latch output based on the clock signal.

18. The flip-flop of claim 17, wherein the first gating element is arranged to be off when second gating element is on, and vice versa.

19. The flip-flop of claim 7, wherein the slave forward drive element comprises an inverter, and the one or more slave forward drive enhancement elements comprise respective inverters.

* * * * *